United States Patent
Selvamanickam et al.

(10) Patent No.: US 7,074,744 B2
(45) Date of Patent: *Jul. 11, 2006

(54) APPARATUS FOR CONSECUTIVE DEPOSITION OF HIGH-TEMPERATURE SUPERCONDUCTING (HTS) BUFFER LAYERS

(75) Inventors: Venkat Selvamanickam, Wynantskill, NY (US); Srinivas Sathiraju, Riverside, OH (US)

(73) Assignee: SuperPower, Inc., Schenectady, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 11/131,834

(22) Filed: May 18, 2005

(65) Prior Publication Data

US 2005/0208204 A1  Sep. 22, 2005

Related U.S. Application Data

(63) Continuation of application No. 10/609,065, filed on Jun. 26, 2003, now Pat. No. 6,906,008.

(51) Int. Cl.
   *C23C 16/00* (2006.01)
   *C23C 14/34* (2006.01)

(52) U.S. Cl. .................. 505/475; 505/476; 505/477; 505/473; 204/192.24; 204/192.12; 427/255.24; 427/501; 427/513; 427/538; 427/171; 427/172; 427/175; 427/177; 427/178

(58) Field of Classification Search ........... 204/192.12, 204/192.24, 298.24; 118/718, 724, 728, 118/33; 427/251, 255.5, 255.24, 482, 501, 427/513, 538, 171, 172, 175, 177, 178; 505/434, 505/473, 475, 476, 477

See application file for complete search history.

(56) References Cited

U.S. PATENT DOCUMENTS

| | | | |
|---|---|---|---|
| 3,829,373 A | | 8/1974 | Kuehnle |
| 3,884,787 A | | 5/1975 | Kuehnle |
| 4,562,093 A | | 12/1985 | Mario et al. |
| 4,763,601 A | | 8/1988 | Saida et al. |
| 5,968,877 A | | 10/1999 | Budai et al. |
| 6,673,387 B1 | | 1/2004 | Zhang et al. |
| 6,906,008 B1 | * | 6/2005 | Selvamanickam et al. .. 505/434 |

OTHER PUBLICATIONS

Savvides, et al., "High Jc YBCO Conductors Fabricated by Magnetron Deposition", Mat. Res. Soc. Symp. Proc., vol. 616, pp. 199-204: 2000.
Arendt, et al., "YBCO/YSZ Coated conductors on Flexible Ni Alloy Substrates", Appl. Supercond., vol. 4, pp. 429-434, 1998.

* cited by examiner

*Primary Examiner*—Rodney G. McDonald
(74) *Attorney, Agent, or Firm*—Larson Newman Abel Polansky & White, LLP

(57) ABSTRACT

A method of coating a substrate for a high temperature superconductor material is disclosed, including loading a substrate into a first deposition chamber, routing the substrate in the first deposition chamber such that the substrate forms a helical winding in the first deposition chamber, and depositing a first buffer layer to overlie the substrate as the substrate translates along the helical winding. The buffer layer has a biaxial crystallographic texture.

22 Claims, 3 Drawing Sheets

APPARATUS FOR CONSECUTIVE DEPOSITION OF HIGH-TEMPERATURE SUPERCONDUCTING (HTS) BUFFER LAYERS

CROSS-REFERENCE TO RELATED APPLICATION(S)

The present application is a continuation application of U.S. application Ser. No. 10/609,065, filed Jun. 26, 2003 now U.S. Pat. No. 6,906,008, which is incorporated herein by reference in its entirety.

FIELD OF THE INVENTION

The present invention relates to the high-throughput deposition of HTS buffer layer thin films and is further related to both IBAD and sputtering systems.

BACKGROUND OF THE INVENTION

In the past three decades, electricity has risen from 25% to 40% of end-use energy consumption in the United States. With this rising demand for power comes an increasingly critical requirement for highly reliable, high quality power. As power demands continue to grow, older urban electric power systems in particular are being pushed to the limit of performance, requiring new solutions.

Wire forms the basic building block of the world's electric power system, including transformers, transmission and distribution systems, and motors. The discovery of revolutionary high-temperature superconductor (HTS) compounds in 1986 led to the development of a radically new type of wire for the power industry; this discovery is the most fundamental advance in wire technology in more than a century.

HTS wire offers best-in-class performance, carrying over one hundred times more current than conventional copper and aluminum conductors of the same physical dimension do. The superior power density of HTS wire will enable a new generation of power industry technologies. It offers major size, weight, and efficiency benefits. HTS technologies will drive down costs and increase the capacity and reliability of electric power systems in a variety of ways.

For example, HTS wire is capable of transmitting two to five times more power through existing rights of way. This new cable will offer a powerful tool to improve the performance of power grids while reducing their environmental footprint. However, to date only short samples of the HTS tape used in the manufacture of next-generation HTS wires have been fabricated at high performance levels. In order for HTS technology to become commercially viable for use in the power generation and distribution industry, it will be necessary to develop techniques for continuous, high-throughput production of HTS tape.

One challenge facing the high-throughput production of HTS tape is the optimization of the buffer layers atop which the superconducting layer is deposited. Buffer layers are deposited atop a metal substrate, such as a stainless steel or nickel substrate, and are grown with preferential crystallographic texture so as to enable the optimum crystalline alignment of a subsequently deposited layer of HTS material, such as yttrium-barium-copper-oxide (YBCO). However, the elongated and non-symmetric YBCO unit cell has posed challenges to the growth of superconductor materials that utilize YBCO as a superconducting layer.

Budai et al., U.S. Pat. No. 5,968,877, dated Oct. 19, 1999 and entitled "High Temperature YBCO Superconductor Deposited on Biaxially Textured Ni Substrate," provides a superconductor material that includes the buffer layers cerium oxide ($CeO_2$) and yttrium-stabilized zirconia (YSZ), and a top layer of in-plane aligned, c-axis oriented YBCO that achieves a critical current density ($J_c$) in the range of 100,000 $A/cm^2$ at 77 K. However, only short lengths of HTS tapes have been fabricated at such high performance levels. Further, the process of Budai et al. necessitates separate deposition processes occurring at different times to obtain the desired buffer layers.

The high throughput necessary to enable cost-effective production, and hence widespread adaptation of HTS materials, requires a system capable of simultaneous buffer layer deposition processes.

It is therefore an object of the invention to provide a deposition system for the production of HTS tapes that provides a first deposition process that subsequently feeds a second dynamically isolated deposition process such that the continuous sequential deposition of multiple thin films occurs.

It is an object of the invention to provide a high throughput deposition system utilizing two deposition zones in a single chamber.

It is an object of this invention to simultaneously subject a translating substrate to two different processes in a single deposition chamber.

It is an object of this invention to simultaneously subject a translating substrate to a deposition process and a coating modification process in a single deposition chamber.

It is an object of this invention to provide a multi-chamber modular coating line where the speed and conditions within each deposition chamber may be independently and easily modified without reconfiguring or disassembling the coating line.

BRIEF SUMMARY OF THE PRESENT INVENTION

These and other objects are accomplished by a coating deposition apparatus and system comprising a processing chamber wherein the substrate to be coated passes through a deposition zone multiple times and for a period sufficient to deposit a coating of a predetermined thickness.

In a first embodiment of the invention the processing chamber contains a helically grooved cooling block positioned such that a translating substrate passes through a deposition zone within the processing chamber multiple times.

In a second embodiment of the invention, the processing chamber contains two separate deposition zones, allowing the speed of the process to be increased by a multiple of as much as two.

In another embodiment of the invention, the first deposition chamber contains a deposition zone and a coating modification zone such that the physical or chemical parameters of the coating deposited during each pass of the substrate through the deposition zone are modified during passage through the coating modification zone.

The objects of the invention may also be accomplished by a coating deposition apparatus and system comprising two or more coupled but separate processing chambers where the first processing chamber deposits a first coating on a substrate and the second chamber deposits a second coating on the substrate.

The coating and deposition parameters and/or conditions are different in each processing chamber.

The essential step and apparatus allowing the beneficial results of the invention is a helically wound cooling block in the first deposition chamber, positioned such that the incoming translating substrate enters a first process zone on a first face of the cooling block, moves to a second process zone on the opposite face of the cooling block and then re-enters the first process zone as it moves around the helically grooved cooling block. The substrate translates through the two process zones multiple times before it exits the first process chamber and enters the second process chamber.

Either or both of the process zones may be a deposition zone. If both process zones are deposition zones the deposition parameters may be the same or different in each process zone. If one process zone is deposition zone, the other process zone may be a coating parameter modification zone.

The present invention is a deposition system for the production of HTS tapes that provides a first deposition process that subsequently feeds a second deposition process, where the two deposition processes are occurring concurrently. A substrate tape translates through first and second deposition chambers via the action of a reel-to-reel tape transport system. The two deposition chambers are coupled by any conventional means that is capable of maintaining any appropriate pressure differential between the deposition chambers, such as, for example, via a tee-tube that is connected to a turbo pump. The tee-tube and the turbo pump are sized appropriately to maintain a pressure difference of between one and two orders of magnitude between the first and second deposition chambers. As a result, the first deposition chamber is dynamically isolated from the second deposition chamber such that an ion beam-assisted deposition (IBAD) process may deposit, for example, YSZ or MgO in the first deposition chamber and a sputtering process may deposit, for example, $CeO_2$ in the second deposition chamber. Alternative equivalent coupling means are also contemplated.

The differences in the desired buffer layer film thicknesses and the differing deposition rates that characterize the processes of the two deposition chambers are accommodated by the creation of a deposition zone of extended length within the first deposition chamber, in which an IBAD process, for example, is likely to occur. The extended deposition zone length within the first process chamber is achieved by helically wrapping the substrate tape around a cooling block such that the tape translates through the deposition zone multiple times before passing into the second deposition chamber.

The differing rates of deposition likely to be encountered in the processing occurring in the first and second process chambers may also be accommodated by utilizing a shield within the second deposition chamber, in which a sputtering process, for example, is likely to occur, to limit the deposition zone length to accommodate the desired second layer film thickness.

Thus, the system and apparatus of the invention are sufficiently flexible to accommodate changes in processing parameters or deposition procedures without occasioning extensive downtime or modification costs, while still maintaining the benefits of an inline integrated processing system.

DETAILED DESCRIPTION OF THIS INVENTION

Figure 1:
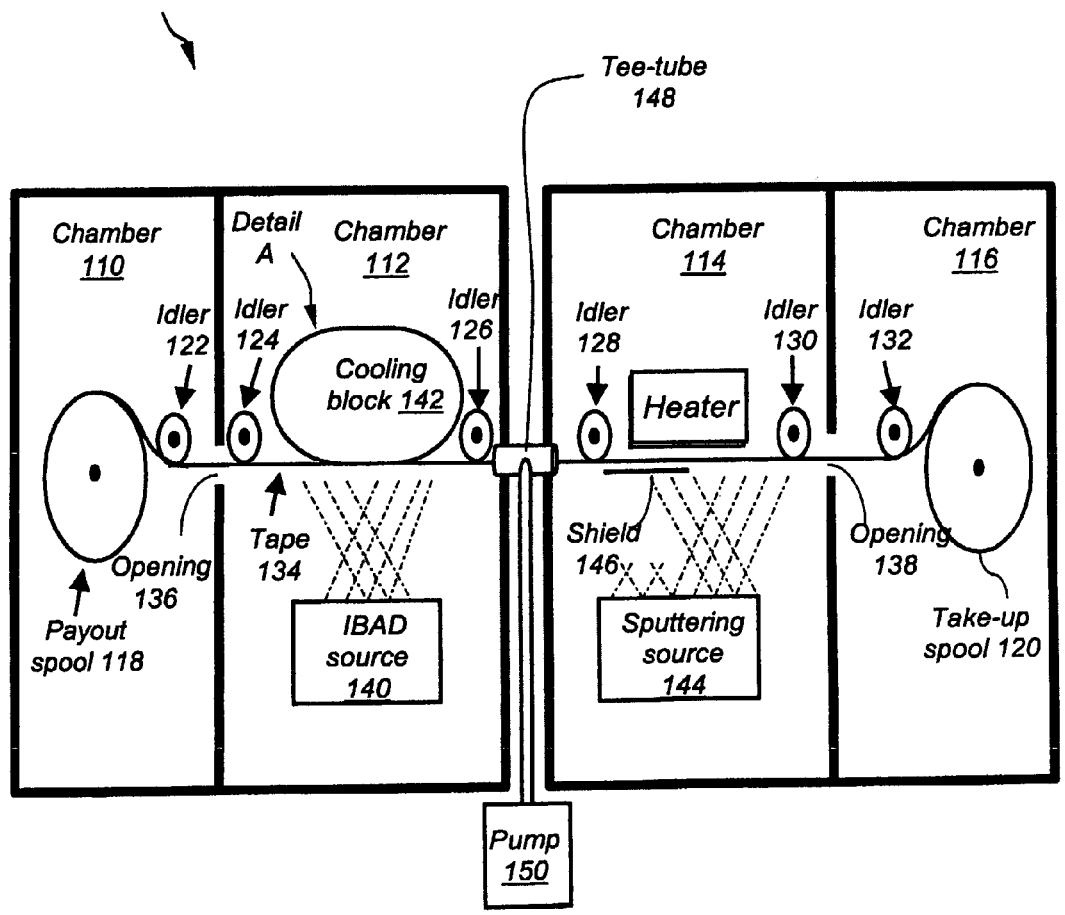
FIG. 1 illustrates a front view of the consecutive deposition system of the present invention.

FIG. 1 illustrates a front view of a consecutive deposition system 100 in accordance with the present invention. The consecutive deposition system 100 includes a chamber 110, a chamber 112, a chamber 114, and a chamber 116. The chamber 110 is a chamber that houses a payout spool 118. The chamber 112 is a pressurized vacuum chamber in which an IBAD process occurs, as is well known to the art. The chamber 114 is a pressurized vacuum chamber in which a sputtering process such as RF magnetron sputtering or pulsed DC magnetron sputtering occurs, as is well known to the art. The chamber 116 is a chamber that houses a take-up spool 120. An opening 136 through which a tape 134 translates is disposed in the wall between the chamber 110 and the chamber 112. Likewise, an opening 138 through which the tape 134 translates is disposed in the wall between the chamber 114 and the chamber 116. The diameter of the opening 136 and the opening 138 is sufficient to enable passage of the tape 134, but is not restricted on its upper limit, as it is unnecessary to maintain a pressure and/or temperature difference between the chamber 110 and the chamber 112, and between the chamber 114 and the chamber 116, respectively.

The tape 134 is a polished length of metal substrate formed from a variety of metals capable of withstanding temperatures up to 900° C., such as stainless steel or a nickel alloy such as Inconel, upon which buffer layer deposition occurs. The tape 134 may have the following dimensions, for example: a thickness of 25 microns, a width of 1 cm, and a length of 100 meters. The payout spool 118 and the take-up spool 120 are elements of a reel-to-reel tape transport system that may further include motors (not shown) and a controller (not shown) that govern the translation of the tape 134 through the consecutive deposition system 100. Arranged between the payout spool 118 and the take-up spool 120 are an idler 122, an idler 124, an idler 126, an idler 128, an idler 130, and an idler 132 that come into contact with the non-coated side of the tape 134 and maintain the tape 134 at an optimal positioning as the tape 134 translates through the consecutive deposition system 100. The number and positioning of the idlers 122, 124, 126, 128, 130, and 132 may vary depending on the dimensions of the chambers 110, 112, 114, and 116 and the application. For example, the idlers 122, 124, 126, 128, 130, and 132 may be disposed one per meter of the tape 134.

Further included in the consecutive deposition system 100 and housed in the chamber 112 is an IBAD source 140 and a cooling block 142 arranged with respect to one another so as to optimize performance of the IBAD process that occurs therein. The IBAD source 140 may include an e-beam evaporator assembly and an RF ion source, as well as other elements well known to the art that are necessary to enable an IBAD process to occur. Other embodiments of the invention use varying energy sources in the IBAD process, such as an ion beam sputtering or magnetron sputtering source.

Magnetron sputtering-based energy source is disclosed in Savvides, N. et al. "High $J_c$ YBCO Conductors Fabricated by Magnetron Deposition" Mat. Res. Soc. Symp. Proc., vol. 616, page 199–204 [2000], the disclosure of which is incorporated herein and made a part hereof. The sputtering source may also be an ion beam sputtering source as disclosed in Arendt, P. N. et al, "YBCO/YSZ Coated Conductors on Flexible Ni Alloy Substrates", Appl. Supercond. Vol. 4, pp 429–434 (1998), the disclosure of which is incorporated herein and made a part hereof.

The cooling block 142 is an internally cooled metal block incorporating all necessary mounting holes and coolant connectors with which the tape 134 comes into contact and wraps around as the tape 134 translates through the chamber 11 the cooling block may be fabricated from an easy to fabricate metal having good thermal conductivity such as copper or stainless steel.

Figure 2:
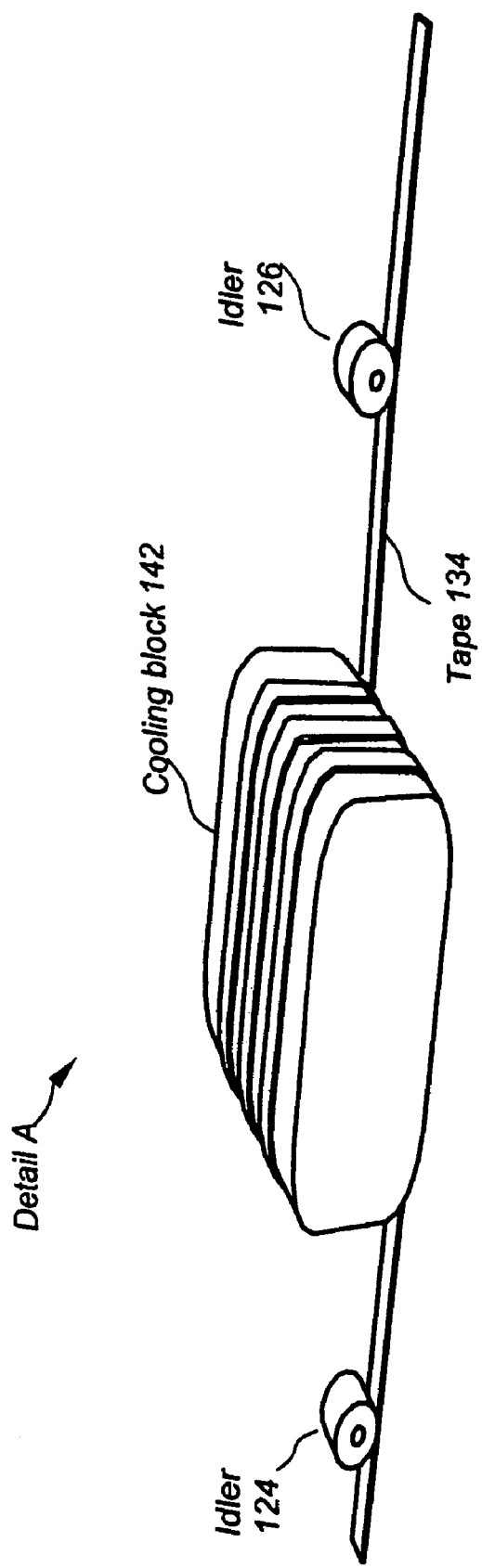
FIG. 2 illustrates a perspective view of the cooling block of the consecutive deposition system of the present invention.

Detail A, shown in FIG. 2, illustrates a perspective view of the cooling block 142. The cooling block 142 may further include a series of passageways through which a cooling gas ejected toward the uncoated side of the tape 134 to enhance the removal of heat from the tape 134. The cooling block 142 is positioned within the chamber 112 such that a deposition zone for the tape 134 is created at the bottom surface of the cooling block 142. In addition, the cooling block 142 may include a shutter (not shown) that can be opened or closed to expose the tape 134 to the deposition zone. The cooling block 142 is further described in reference to FIG. 2.

Further included in the consecutive deposition system 100 and housed in the chamber 114 is a sputtering source 144 and a shield 146. The sputtering source 144 may include elements that enable an RF magnetron sputtering or a pulsed DC magnetron sputtering process to occur and thereby deposit the desired buffer layer thin film atop the tape 134 as the tape 134 translates through the chamber 114. Another component included in chamber 114 is a heater to heat the coated tape so as to deposit the sputtered layer at a high temperature. A temperature range of 300 to 950° C. and more preferably 600 to 850° C. is used for epitaxial growth of the layer on the substrate. The shield 146 may be a high-temperature alloy or a ceramic-coated metal element that is disposed between the sputtering source 144 and the tape 134. Examples include Inconel or hastelloy with a YSZ coating or a coating of the oxide material that is being coated on the substrate.

A tee-tube 148 provides coupling and dynamic isolation between the chamber 112 and the chamber 114. The tee-tube 148 is a custom-sized conventional vacuum tube commonly used to connect and dynamically isolate two vacuum chambers. The tee-tube 148 is likely to measure between about six and twelve inches in length and have a diameter just sufficient to accommodate the passage of the tape 134, e.g., less than one inch, as it is well known that the diffusion between two chambers is proportional to the diameter and inversely proportional to the length of the tube connecting the two. The tee-tube 148 is connected to a pump 150 that is, for example, a conventional turbo pump. The tee-tube 148 and the pump 150 enable a pressure difference between one and two orders of magnitude to be maintained between the chambers 112 and 114; for example, the chamber 112 may operate at a pressure of $10^{-4}$ Torr while the chamber 114 is maintained at a pressure of between $10^{-3}$ and $10^{-2}$ Torr.

FIG. 2 shows Detail A of FIG. 1 that illustrates a perspective view of the cooling block 142. FIG. 2 further illustrates the helical wrapping of the tape 134 about the cooling block 142, and includes the idlers 124 and 126 for illustrative purposes.

The cooling block 142 is shaped similar to a racetrack from a front view perspective, with a thickness sufficient to accommodate the desired width of the deposition zone that characterizes the IBAD source 140, and, for example, may measure 15 cm in width to accommodate twelve wraps of the tape 134. Depending on the particular results desired, such as total coating thickness or translation speed, the block may be fabricated to accommodate as few as 2 or as many as 16 helical windings. In most instances, the block will have from 6 to 12, preferably 8 to 10 windings.

The bottom side of the cooling block is slightly curved. The radius of curvature of the bottom side of the cooling block 142 is very large, e.g., 10–20 feet, in order to enable the tape 134 to remain relatively flat the entire time that deposition is occurring to the tape 134. The cooling block 142 includes a shallow helical depression, e.g., 1 mil deep, to accommodate the translation of the tape 134 as it helically slides around the cooling block 142.

The consecutive deposition system 100 provides a first HTS buffer layer deposition process that subsequently feeds a second HTS buffer layer deposition process, where the two deposition processes are occurring concurrently atop the tape 134. In operation, the tape 134 unwinds from the payout spool 118 and through the opening 136 between the chambers 110 and 112. The tape 134 is then subjected to an IBAD process that deposits a first buffer layer, such as a YSZ or MgO buffer layer. The tape 134 wraps helically about the cooling block 142 such that the tape 134 is exposed to the deposition zone created between the surface of the cooling block 142 and the IBAD source 140 a plurality of times. The tape 134 next passes through the tee-tube 148 and into the chamber 114 while the pump 150 evacuates the volume present within the tee-tube 148. The tape 134 is exposed to a sputtering process within the chamber 114 in which a second buffer layer, such as a $CeO_2$ buffer layer, may be deposited atop the tape 134 as it exposed to material from the sputtering source 144. The shield 146 may block a certain portion of the sputtering source 144 to optimize the second buffer layer film thickness and to accommodate the translational velocity of the tape 134 as is stipulated by the deposition rate of the IBAD process that occurs within the chamber 112. The tape 134 subsequently translates through the opening 138 and onto the take-up spool 120 housed within the chamber 116. The idlers 122, 124, 126, 128, 130, and 132 maintain the tape 134 at an optimum positioning for the deposition processes that occur within the consecutive deposition system 100.

In a first example, it may be desirable to deposit the buffer layers of YSZ and $CeO_2$ with a thickness of 0.5 microns (5000 Angstroms) and 0.01 microns (100 Angstroms), respectively. The IBAD process is likely to achieve a deposition rate of one Angstrom per second in the chamber 112 and a deposition zone of, for example, 1.2 meters in length. The tape 134 must be exposed to the deposition zone within the chamber 112 for approximately 5000 seconds, for example. In this example, to attain the desired film thickness, the tape 134 may be wrapped about the cooling block 142 twelve times, such that it is exposed to 14.4 meters of deposition zone (12 wraps×1.2 meters) and translates at a speed of 10.4 meters/hr. The sputtering process that occurs within the chamber 114 may be characterized by a similar deposition rate as the IBAD process, e.g., 1 Angstrom per second, and thus the tape 134 must undergo approximately 100 seconds of sputtering to achieve the desired CeO2 film thickness of 100 Angstroms. The sputtering source 144, therefore, may be chosen to be 0.288 meters in length by an appropriate positioning of the shield 146 or by sizing of the sputtering source 144 to accommodate the translational velocity of 10.4 meters/hr of the tape 134 through the consecutive deposition system 100.

In a second example, it may be desirable to deposit the buffer layers of MgO and $CeO_2$ with a thickness of 100 Angstroms and 2000 Angstroms, respectively. With an IBAD process similar to that of the first example, i.e., a deposition rate of 1 Angstrom per second, a deposition zone of 1.2 meters in length, and the number of times the tape 134 wraps around the cooling block 142 equal to twelve, the reduction of thickness in the first buffer layer enables the tape 134 to translate through the consecutive deposition system 100 much faster, as there exists a wide range in deposition rates achievable by the sputtering process. Sputtering of $CeO_2$ at a rate of 30 Angstroms per second and exposure of the tape 134 to the sputtering source 144 for the 66.67 seconds necessary to obtain the 2000 Angstroms film thickness enables the tape 134 to translate at 150 meters/hr over a sputtering source 144 2.78 meters in length.

Figure 3:
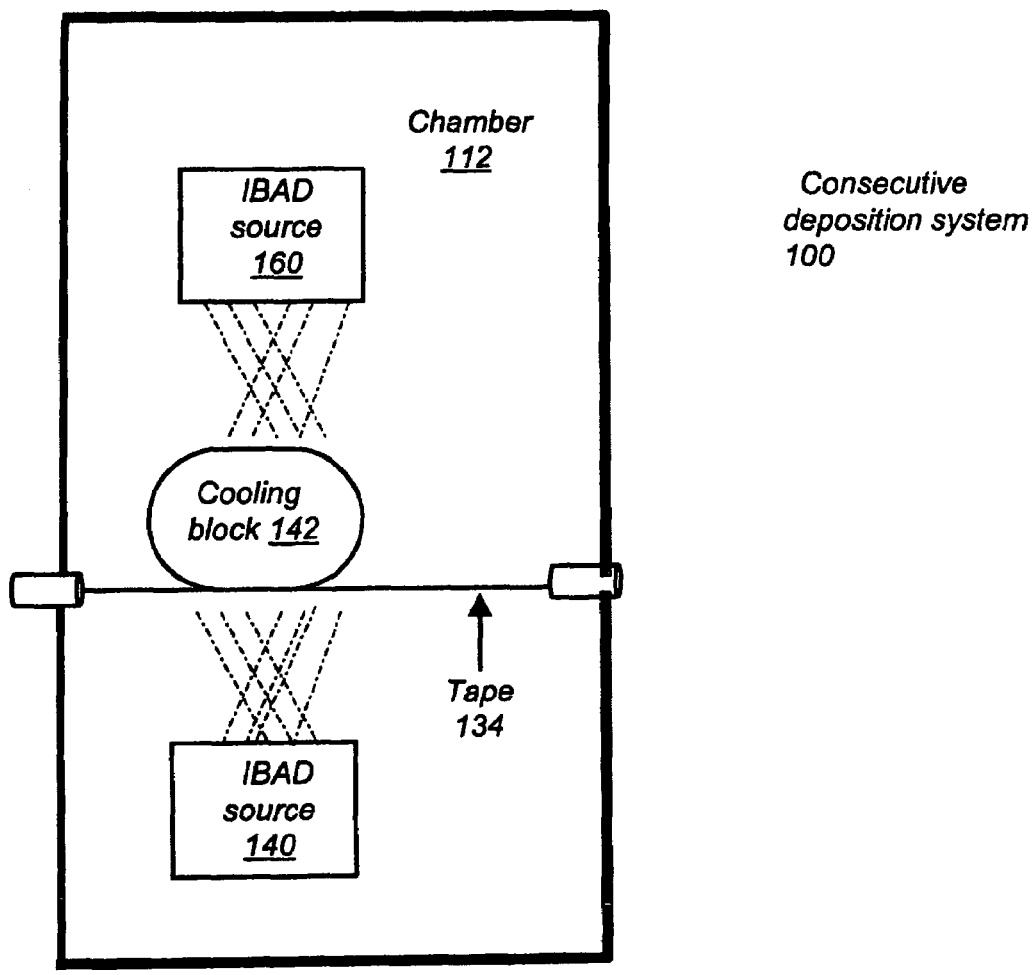
FIG. 3 illustrates a two-process zone embodiment of the invention.

In the configuration disclosed in FIG. 1 deposition is conducted in a single deposition zone shown as located at the bottom of the cooling block. In this embodiment when the tape moves out of the bottom deposition zone it is not coated until it rides over the top of the helically channeled cooling block and re-enters the deposition zone at the bottom of the cooling block. FIG. 3 discloses an embodiment where deposition occurs on both faces of the cooling block. IBAD source 140 and IBAD source 160 are disposed on opposite sides of the cooling block, thus providing two separate deposition zones, located diametrically opposite each other and not overlapping each other. Deposition will occur twice during each complete circuit around the cooling block and effectively increase the throughput by a factor of up to 2. It is contemplated that the coating deposited in the second deposition zone may be the same as or different than the coating deposited in the first deposition zone. In addition to a different coating being applied in each coating zone, it is contemplated that the deposition conditions may vary between the two zones. Thus, the length of the zone or the environmental parameters may be the same or different thus yielding a coating of the same chemical composition but with different physical characteristics.

A further variation of the two zone system described above with reference to FIG. 3 involves the substitution of a coating modification zone for the second deposition zone 160 of FIG. 3. In this embodiment, one or more of the layers of the coating deposited in the deposition zone may be modified in the coating modification zone. An example of such a process involves the deposition of an amorphous coating layer in the deposition zone and the conversion of one or more of the amorphous layers to a crystalline for with a preferential texture by ion bombardment in the coating modification zone.

These examples demonstrate the flexibility of the process and the ability to vary parameters such that different coating and/or different coating thicknesses can be accommodated without equipment modifications simply by varying the number of helical turns or the length of the sputtering deposition zone.

The examples provided relate to a specific combination of IBAD and sputtering deposition processes but the same concepts and configurations can be used to continuously deposit varying coating on disparate substrates utilizing other vacuum deposition processes as well.

What is claimed is:

1. A method of coating a substrate for a high temperature superconductor material, comprising:
   feeding a substrate into a first deposition chamber;
   routing the substrate in the first deposition chamber such that the substrate forms a helical winding around a block, the block being fixed and having a non-circular cross section such that the substrate translates with respect to the block; and
   depositing a first buffer layer to overlie the substrate as the substrate translates through the deposition chamber, the first buffer layer having a biaxial crystallographic texture.

2. The method of claim 1, wherein the first buffer layer is comprises YSZ or MgO.

3. The method of claim 1, wherein deposition of the first buffer layer is carried out by sputtering or evaporation.

4. The method of claim 1, wherein deposition of the first buffer layer is carried out by ion beam assisted deposition (IBAD).

5. The method of claim 1, wherein the substrate comprises a metal that can withstand temperatures up to 900° C.

6. The method of claim 5, wherein the substrate comprises stainless steel or a nickel alloy.

7. The method of claim 1, wherein the substrate is loaded into the first deposition chamber using a reel-to-reel transport system.

8. The method of claim 7, wherein the substrate is fed into the deposition chamber from a reel positioned external to the deposition chamber.

9. The method of claim 1, wherein the block is a cooling block.

10. The method of claim 1, wherein deposition takes place in the first deposition chamber along a deposition zone, the deposition zone extending along the block and along which the helical winding extends, wherein the substrate translates through the deposition zone multiple times.

11. The method of claim 10, wherein the deposition zone is planar.

12. The method of claim 1, wherein the block forms first and second opposite major sides each corresponding to first and second deposition zones, wherein deposition of the first buffer layer takes place along the first and second deposition zones.

13. The method of claim 1, wherein the first deposition chamber is held at vacuum during deposition of the first buffer layer.

14. The method of claim 1, wherein the helical winding has between 2 and 16 windings.

15. The method of claim 1, further comprising:
   translating the substrate into a second deposition chamber after exiting from the first deposition chamber, and depositing a second buffer layer to overlie the first buffer layer.

16. The method of claim 15, wherein the second deposition chamber is dynamically isolated from the first deposition chamber.

17. The method of claim 15, wherein the second buffer layer is epitaxially deposited.

18. The method of claim 15, wherein the second buffer layer is deposited by sputtering.

19. The method of claim 15, wherein the second buffer layer comprises $CeO_2$.

20. The method of claim 15, wherein the second buffer layer is deposited at a temperature within a range of 300 to 950° C.

21. The method of claim 20, wherein the temperature is within a range of 600 to 850° C.

22. The method of claim 15, wherein a pressure differential of at least one order of magnitude is maintained between the first and second deposition chambers.

* * * * *